United States Patent
Hikata et al.

(10) Patent No.: US 9,493,354 B2
(45) Date of Patent: Nov. 15, 2016

(54) CARBON NANOSTRUCTURE, AND METHOD AND APPARATUS FOR MANUFACTURING CARBON NANOSTRUCTURE

(71) Applicant: SUMITOMO ELECTRIC INDUSTRIES, LTD., Osaka-shi, Osaka (JP)

(72) Inventors: Takeshi Hikata, Osaka (JP); Soichiro Okubo, Osaka (JP); Risa Utsunomiya, Kyoto (JP); Yugo Higashi, Kyoto (JP); Jun-ichi Fujita, Tsukuba (JP); Katsuhisa Murakami, Tsukaba (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 14/770,630

(22) PCT Filed: Jan. 28, 2014

(86) PCT No.: PCT/JP2014/051752
§ 371 (c)(1),
(2) Date: Aug. 26, 2015

(87) PCT Pub. No.: WO2014/132724
PCT Pub. Date: Sep. 4, 2014

(65) Prior Publication Data
US 2016/0002041 A1 Jan. 7, 2016

(30) Foreign Application Priority Data
Feb. 27, 2013 (JP) .................... 2013-037552

(51) Int. Cl.
*C23C 16/46* (2006.01)
*C01B 31/02* (2006.01)
(Continued)

(52) U.S. Cl.
CPC ............ *C01B 31/0233* (2013.01); *B01J 23/74* (2013.01); *B01J 23/745* (2013.01);
(Continued)

(58) Field of Classification Search
CPC .............. C01B 31/0206; C23C 16/46; Y10T 428/2918; Y10T 428/2975; Y10T 428/298
See application file for complete search history.

(56) References Cited

U.S. PATENT DOCUMENTS

| 2005/0170089 A1* | 8/2005 | Lashmore | .............. B82Y 10/00 427/248.1 |
| 2007/0224107 A1 | 9/2007 | Hikata | |
| 2013/0302552 A1 | 11/2013 | Hikata et al. | |

FOREIGN PATENT DOCUMENTS

| CN | 1886537 A | 12/2006 |
| EP | 1 061 043 A1 | 12/2000 |

(Continued)

OTHER PUBLICATIONS

Eiji Iida et al., "Growth of novel CNFs with pulling carburized Fe artificially", The Japan Society of Applied Physics, Aug. 31, 2013, 17-088 (Partial Translation).

*Primary Examiner* — Andrew Piziali
(74) *Attorney, Agent, or Firm* — Drinker Biddle & Reath LLP

(57) ABSTRACT

A method for manufacturing a carbon nanostructure according to the present invention includes a preparation step of preparing a base body, an oxidization step and a step of growing a carbon nanostructure. In the step of preparing a base body, a base body with at least a part of a contact portion or an integral portion of a catalyst member and a separation member having been oxidized is prepared. In the step of growing a carbon nanostructure, a carbon nanostructure is grown in a separation interface region between the catalyst member and the separation member. The step of growing a carbon nanostructure includes at least one of a step of locally supplying a source gas to a portion of the catalyst member facing the separation interface region where the carbon nanostructure is being grown, and a step of locally heating the separation interface region.

9 Claims, 6 Drawing Sheets

(51) Int. Cl.
*B01J 23/745* (2006.01)
*B01J 23/74* (2006.01)
*B01J 35/00* (2006.01)
*C23C 16/26* (2006.01)
*C23C 16/04* (2006.01)
*B82Y 40/00* (2011.01)

(52) U.S. Cl.
CPC ....... *B01J 35/0013* (2013.01); *C01B 31/0206* (2013.01); *C23C 16/04* (2013.01); *C23C 16/26* (2013.01); *C23C 16/46* (2013.01); *B82Y 40/00* (2013.01)

(56) References Cited

FOREIGN PATENT DOCUMENTS

| | | |
|---|---|---|
| JP | 2001-020072 A | 1/2001 |
| JP | 2001-048512 A | 2/2001 |
| JP | 2005-330175 A | 12/2005 |
| JP | 2007-515364 A | 6/2007 |
| JP | 2013-237572 A | 11/2013 |
| WO | WO-2005/044723 A2 | 5/2005 |
| WO | WO 2012128763 A1 * | 9/2012 ............ B82Y 10/00 |

* cited by examiner

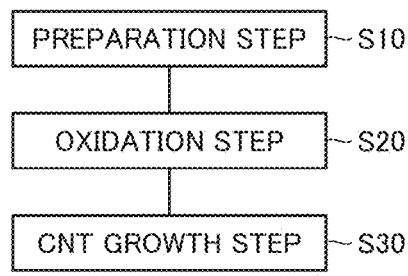
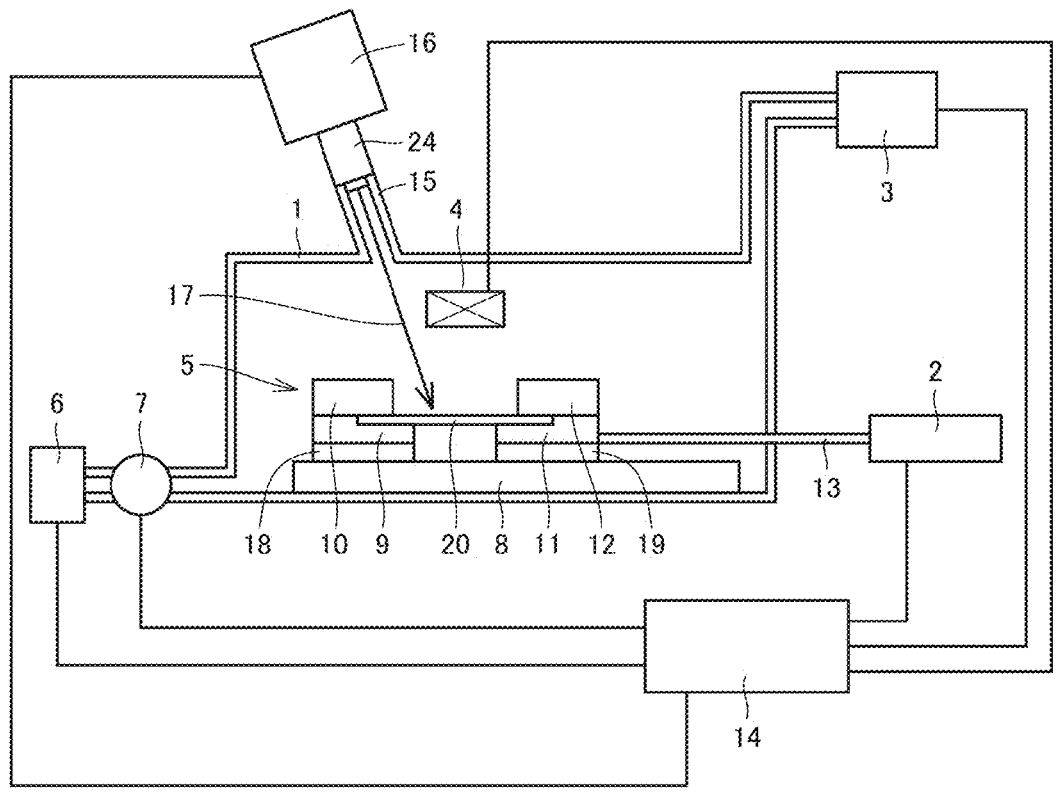

CARBON NANOSTRUCTURE, AND METHOD AND APPARATUS FOR MANUFACTURING CARBON NANOSTRUCTURE

TECHNICAL FIELD

The present invention relates to a carbon nanostructure and a method and an apparatus for manufacturing a carbon nanostructure, and more particularly to a carbon nanostructure that extends in one direction, and a method and an apparatus for manufacturing a carbon nanostructure.

BACKGROUND ART

Conventionally, there has been known a carbon nanostructure including a linear structure in which carbon atoms are aligned in a nanometer-level diameter and a sheet-like structure constituted by carbon atoms and having a nanometer-level thickness, which are typified by carbon nanotube, graphene and the like. As a method for manufacturing such carbon nanostructure, there has been proposed a method for supplying a carbon-containing source gas to a heated fine catalyst, thereby growing a carbon nanostructure from the catalyst (refer to, for example, Japanese Patent Laying-Open No. 2005-330175).

CITATION LIST

Patent Document

PTD 1: Japanese Patent Laying-Open No. 2005-330175

SUMMARY OF INVENTION

Technical Problem

In the conventional method, however, a bend occurred in some cases at the carbon nanostructure grown from the catalyst. As for the carbon nanotube, for example, a five-membered ring or seven-membered ring, not a six-membered ring forming the carbon nanotube, was present in the portion where the bend occurred, and thus, the properties of the carbon nanotube changed locally (e.g., the electrical resistance became high).

In order to reduce occurrence of the bend at the carbon nanostructure described above, applying a tension to the carbon nanostructure during growth of the carbon nanostructure was also contemplated. It was difficult, however, to chuck a tip of the fine carbon nanostructure grown from the catalyst and apply a tension to the carbon nanostructure, and the obtained carbon nanostructure was limited in length.

The present invention has been made to solve the above-described problems, and an object of the present invention is to provide a long carbon nanostructure with reduced occurrence of a bend, a method for manufacturing the carbon nanostructure, and a manufacturing apparatus used in the method for manufacturing the carbon nanostructure.

Solution to Problem

A method for manufacturing a carbon nanostructure according to the present invention includes the steps of preparing a base body and growing a carbon nanostructure. In the step of preparing a base body, a base body formed of a catalyst member including a catalyst and a separation member that are in contact with or integral with each other, at least a part of a contact portion or an integral portion of the catalyst member and the separation member having been oxidized, is prepared. In the step of growing a carbon nanostructure, a carbon nanostructure is grown in a separation interface region between the catalyst member and the separation member, by heating the base body with the separation member being separated from the catalyst member while supplying a source gas containing carbon to the base body. The step of growing a carbon nanostructure includes at least one of a step of locally supplying the source gas to a portion of the catalyst member facing the separation interface region where the carbon nanostructure is being grown, and a step of locally heating the separation interface region.

With this, in the above-described separation interface region of the catalyst member, the process of reduction, carburization and growth of a carbon nanostructure will progress locally. Furthermore, since the tip of the carbon nanostructure (the end opposite to the end on the catalyst member side) is connected to the separation member, a constant tension can be applied to the carbon nanostructure by separating the separation member from the catalyst member. Therefore, in the above-described separation interface region of the catalyst member, as the carbon nanostructure is grown, a part of the carbonized catalyst member is separated to be drawn into the carbon nanostructure as fine particles. With the separation of a part of the catalyst member, the newly formed surface of the catalyst member is exposed in the separation interface region, and the process of reduction, carburization and growth of a carbon nanostructure newly progresses at the newly formed surface. Such a process is promoted particularly by locally heating the above-described separation interface region of the catalyst member, or by locally supplying the source gas to the separation interface region. As a result, the long carbon nanostructure with reduced occurrence of a bend and the like can be obtained.

A method for manufacturing a carbon nanostructure according to the present invention includes the steps of preparing a base body and growing a carbon nanostructure. In the step of preparing a base body, a base body formed of a catalyst member including a catalyst and a separation member that are in contact with or integral with each other, at least a part of a contact portion or an integral portion of the catalyst member and the separation member having been oxidized, is prepared. In the step of growing a carbon nanostructure, a carbon nanostructure is grown in a separation interface region between the catalyst member and the separation member, by heating the base body with the separation member being separated from the catalyst member while supplying a source gas containing carbon to the base body. In the step of growing a carbon nanostructure, by partially separating the catalyst member from a surface portion of the catalyst member where the carbon nanostructure is being grown to be drawn into the carbon nanostructure, the carbon nanostructure is grown continuously while a newly formed surface appears at the surface portion.

With this, in the newly formed surface of the catalyst member exposed successively in the separation interface region, the process of reduction, carburization and growth of a carbon nanostructure will progress. As a result, growth of a carbon nanostructure in which the separation member extends in the direction away from the catalyst member is maintained continuously. Therefore, the long carbon nanostructure with reduced occurrence of a bend and the like can be obtained.

The carbon nanostructure according to the present invention includes a linear structure portion made of carbon having a length of more than or equal to 1 mm, and metal nanoparticles arranged within the linear structure portion in a dispersed manner. With this, the characteristics of the carbon nanostructure can be adjusted by appropriately selecting the type of the metal nanoparticles (e.g., the magnetic property of the carbon nanostructure can be adjusted by arranging magnetic metal as metal constituting the metal nanoparticles).

An apparatus for manufacturing a carbon nanostructure according to the present invention includes a holding portion, a driving member, a gas supply portion, and a heating member. The holding portion is capable of holding a base body formed of a catalyst member including a catalyst and a separation member that are in contact with or integral with each other, at least a part of a contact portion or an integral portion of the catalyst member and the separation member having been oxidized, on a catalyst member side and on a separation member side. The driving member moves the holding portion to separate the separation member from the catalyst member. The gas supply portion supplies a source gas to the base body. The heating member is capable of locally heating a part of the base body.

By using such apparatus, a long carbon nanostructure 30 with reduced bend can be grown in the separation interface region between the catalyst member and the separation member or a fracture interface between base body portions 25 and 26 where a base body 20 has been fractured shown in FIG. 4.

Advantageous Effects of Invention

According to the present invention, the long carbon nanostructure with reduced occurrence of a bend and the like can be obtained.

BRIEF DESCRIPTION OF DRAWINGS

FIG. 1 is a flowchart for describing a method for manufacturing a carbon nanostructure according to a first embodiment of the present invention.

FIG. 2 is a schematic cross-sectional view for describing an apparatus for manufacturing the carbon nanostructure according to the present invention, which is used in the method for manufacturing the carbon nanostructure shown in FIG. 1.

DESCRIPTION OF EMBODIMENTS

Figure 3:
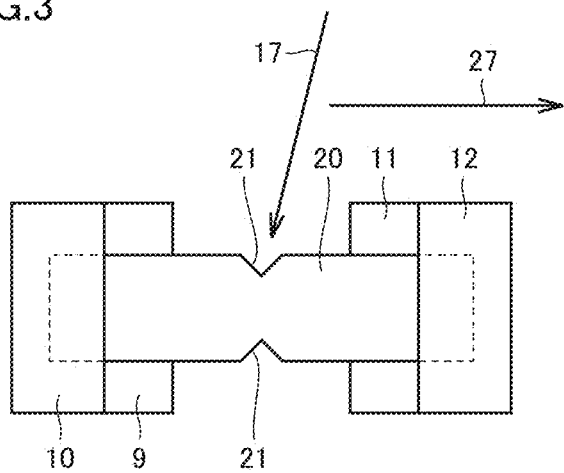
FIG. 3 is a partial schematic view of the apparatus for manufacturing the carbon nanostructure shown in FIG. 2.

Embodiments of the present invention will be described hereinafter with reference to the drawings, in which the same reference numerals are given to the same or corresponding portions and description thereof will not be repeated.

First Embodiment

A method for manufacturing a carbon nanostructure according to a first embodiment of the present invention will be described with reference to FIGS. 1 to 4.

Referring to FIG. 1, in the method for manufacturing the carbon nanostructure according to the present invention, a preparation step (S10) is first performed. In this step (S10), a base body formed of a catalyst member including a catalyst and a separation member that are in contact with or integral with each other is prepared.

As shown in FIGS. 2 and 3, a metal sheet (metal foil) serving as a catalyst can be used as base body 20. Pure iron, nickel, cobalt and the like can, for example, be used as the metal. A notch 21, which is a recessed portion for defining a position of fracture in a CNT growth step (S30) (refer to FIG. 1) described below, is preferably formed in base body 20. When the metal foil as shown in FIGS. 2 and 3 is used as base body 20, the metal foil forms the above-described catalyst member and separation member that are integral with each other.

An apparatus for manufacturing the carbon nanostructure for performing the method for manufacturing the carbon nanostructure will now be described with reference to FIGS. 2 and 3. As shown in FIG. 2, the apparatus for manufacturing the carbon nanostructure includes a reaction chamber 1, a heating member 4 arranged within reaction chamber 1, fixing blocks 9 to 12 arranged to face heating member 4, for holding base body 20, a base platform 8 for supporting fixing blocks 9 to 12, a driving member 2 coupled to fixing block 11 by a coupling rod 13, a gas supply portion 3 for supplying a source gas and the like to reaction chamber 1, a pump 7 and a discharge portion 6 for discharging the gas from reaction chamber 1, a laser beam oscillation portion 16 for locally heating base body 20, cooling members 18 and 19 for locally cooling base body 20, and a controller 14 for controlling heating member 4, gas supply portion 3, driving member 2, pump 7, discharge portion 6, laser beam oscillation portion 16, and cooling members 18 and 19.

Fixing blocks 9 to 12 are arranged on base platform 8 within reaction chamber 1. One end of base body 20 is grasped by fixing blocks 9 and 10. The other end of base body 20 is grasped by fixing blocks 11 and 12. The one and other ends of base body 20 can be locally cooled by cooling members 18 and 19 via fixing blocks 9 and 11, respectively. Fixing block 11 (and cooling member 19) is (are) movable on base platform 8. On the other hand, fixing blocks 9, 10 and cooling member 18 are fixed to base platform 8. Base body 20 prepared in the above-described step (S10) is arranged within reaction chamber 1 of the manufacturing apparatus as shown in FIGS. 2 and 3.

As the structure of cooling members 18 and 19, any conventionally-known structure can be adopted. For example, a thermoelectric element such as a Peltier device may be used, or water or another cooling medium may be circulated within cooling members 18 and 19. The cooling medium may be delivered from the inside of cooling members 18 and 19 to the outside of reaction chamber 1, and cooled by a heat exchanger or the like on the outside, and then flown back again to the inside of cooling members 18 and 19.

Heating member 4 is arranged to face base body 20 fixed by fixing blocks 9 to 12. Although heating member 4 is arranged within reaction chamber 1, heating member 4 may be arranged outside reaction chamber 1 when a wall of reaction chamber 1 is formed by a translucent member such as quartz. An arbitrary heating device such as an electrothermal heater can, for example, be used as heating member 4.

In order to locally heat a part of base body 20 (specifically, a region to be fractured, located between notches 21), laser beam oscillation portion 16 is arranged. An opening is formed in a wall surface (upper wall surface) of reaction chamber 1, and a cylindrical laser beam introduction portion 15 is connected to the opening. Laser beam oscillation portion 16 is connected to laser beam introduction portion 15 with an optical system 24 interposed therebetween. Base body 20 located within reaction chamber 1 is irradiated with a laser beam 17 oscillated from laser beam oscillation portion 16 through the inside of optical system 24 and laser beam introduction portion 15.

Next, the oxidation step (S20) is performed. In this step, at least a part of a contact portion of the catalyst member and the separation member in base body 20 is oxidized. Specifically, by setting the atmosphere within reaction chamber 1 to the air atmosphere and heating base body 20 by heating member 4, base body 20 is oxidized.

Next, the CNT growth step (S30) is performed. In this step (S30), a carbon nanostructure is grown. Specifically, in this step (S30), base body 20 is locally heated by irradiating a portion of base body 20 to be fractured with laser beam 17 oscillated from laser beam oscillation portion 16, and a carbon-containing source gas is supplied from gas supply portion 3 to reaction chamber 1. On this occasion, the one and other ends of base body 20 are cooled by cooling members 18 and 19. As a result, the state where the region of base body 20 to be fractured (the portion located between notches 21) has been locally heated can be maintained.

Figure 4:
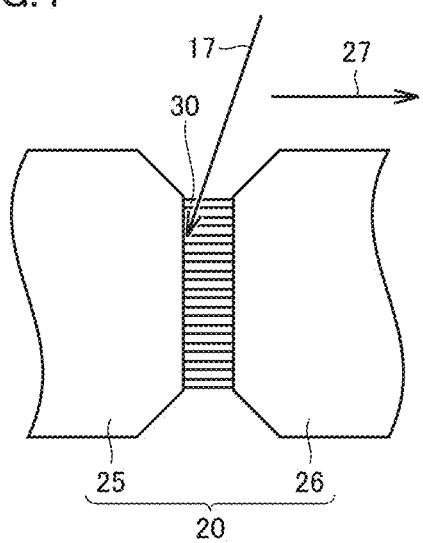
FIG. 4 is a schematic view showing a formed carbon nanostructure.

Then, a step of bringing the source gas into contact with base body 20 including the catalyst member is performed. In this state, fixing blocks 11, 12 and cooling member 19 are moved by driving member 2 in a direction shown by an arrow 27 in FIG. 3. As a result, as shown in FIG. 4, base body 20 is fractured at the portion where notches 21 are formed. In this state (i.e., while separating the separation member, which is a base body portion 26 of base body 20 on the side grasped by fixing blocks 11 and 12, from the catalyst member, which is base body portion 25 of base body 20 on the side grasped by fixing blocks 9 and 10), a fractured end face that is a separation interface region in base body portion 25 in base body 20 is heated by laser light 17 as described above. As a result, as shown in FIG. 4, carbon nanostructure 30 is grown in a fracture interface region of base body 20 that is a separation interface region between the catalyst member and the separation member. The source gas provided from gas supply portion 3 at this time flows in the direction to the left side in FIG. 2 (the opposite direction to the direction in which base body portion 26 is moved by driving member 2).

With this, in the fracture interface region of base body 20, the process of reduction, carburization and growth of a carbon nanostructure is locally performed continuously, and a constant tension is applied to the grown carbon nanostructure. Therefore, carbon nanostructure 30 with reduced deformation such as a bend, which extends from base body portion 25 to base body portion 26, can be easily grown. In addition, since at least a part of base body 20 is preliminarily oxidized, carbon nanostructure 30 can be efficiently grown in the step of growing carbon nanostructure 30.

In regard to the step of supplying the carbon-containing source gas from gas supply portion 3 to reaction chamber 1, bringing the source gas into contact with base body 20, and then, fracturing (separating) base body 20, it is preferable to perform the step of fracturing (separating) base body 20 after the fracture interface region of base body 20 is reduced from oxidation.

In the step of fracturing base body 20, it is preferable to move coupling rod 13, fixing blocks 11, 12 and cooling member 19 by driving member 2, while controlling a tension to prevent formed carbon nanostructure 30 from being fractured. Furthermore, it is preferable to take measures to suppress carburization from the carbon-containing source gas (i.e., prevent embrittlement) by, for example, preliminarily covering a surface of a portion of base body 20 other than the fracture interface region with a coating film such as a film made of precious metal including gold, an oxide and the like.

Figure 5:
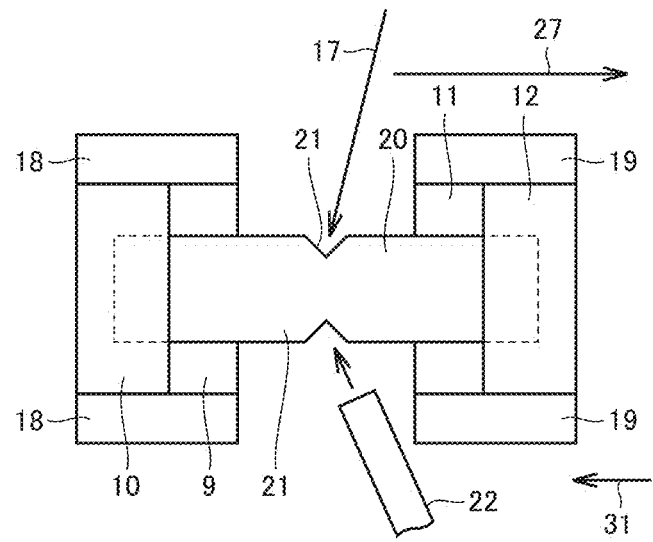
FIG. 5 is a partial schematic view for describing a variation of the apparatus for manufacturing the carbon nanostructure shown in FIG. 2.
Figure 6:
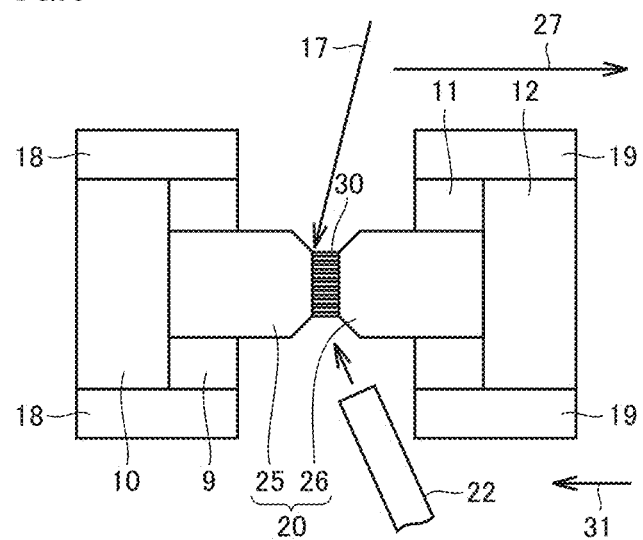
FIG. 6 is a schematic view showing a carbon nanostructure formed by using the apparatus for manufacturing the carbon nanostructure shown in FIG. 5.

Next, referring to FIGS. 5 and 6, a variation of the method for manufacturing the carbon nanostructure and the apparatus for manufacturing the carbon nanostructure shown in FIGS. 1 to 4 will be described.

First, referring to FIG. 5, a variation of the above-described apparatus for manufacturing the carbon nanostructure will be described. The variation of the apparatus for manufacturing the carbon nanostructure basically has a structure similar to that of the manufacturing apparatus shown in FIGS. 2 to 4, but differs from the manufacturing apparatus shown in FIGS. 2 to 4 in that a source gas introduction member 22 for supplying a source gas toward a portion of base body 20 (specifically, the portion to be fractured, located between notches 21) is formed. In this case, when base body 20 is fractured in the state shown in FIG. 3, and carbon nanostructure 30 is formed in the separation interface region between base body portions 25 and 26 as shown in FIG. 4, the source gas can be locally supplied from source gas introduction member 22 toward the separation interface region as indicated by an arrow. An inert gas (e.g., nitrogen gas) as a carrier gas flows in the direction indicated by an arrow 31 in FIG. 6. Therefore, a reactive gas generated from the source gas with formation of carbon nanostructure 30 is discharged from reaction chamber 1 without touching carbon nanostructure 30.

With this, the synergistic effect of local heating by laser beam 17 and cooling of the ends of base body portions 25 and 26 by cooling members 18 and 19 can promote sustaining growth of carbon nanostructure 30 in the separation interface region. In the case of locally supplying the source gas to base body 20 using source gas introduction member 22 described above, carbon nanostructure 30 may be grown while heating base body 20 by heating member 4 in place of laser beam 17.

Figure 7:
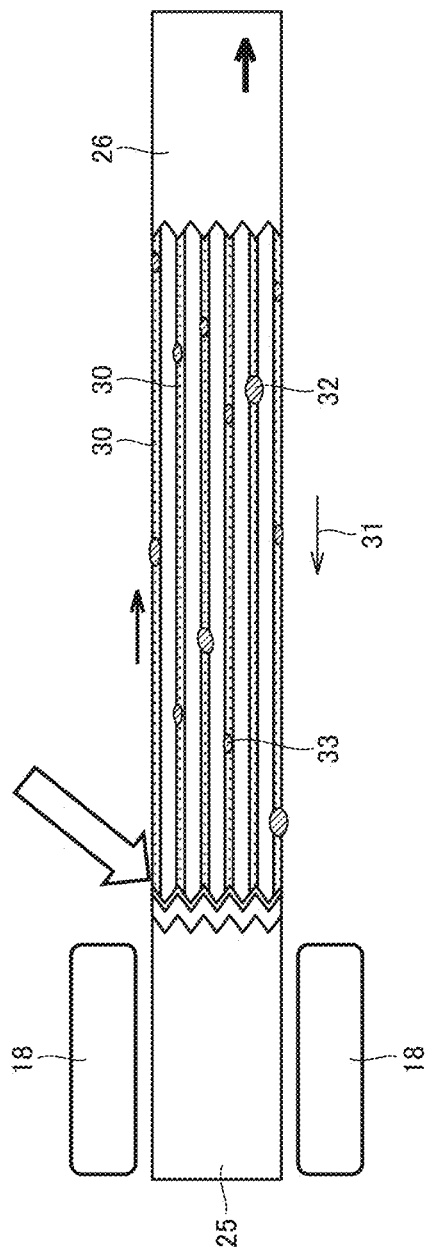
FIG. 7 is a schematic view for describing a formed carbon nanostructure.

Referring to FIG. 7, the sustaining growth of carbon nanostructure 30 in the separation interface region described above will be described in more detail.

Figure 9:
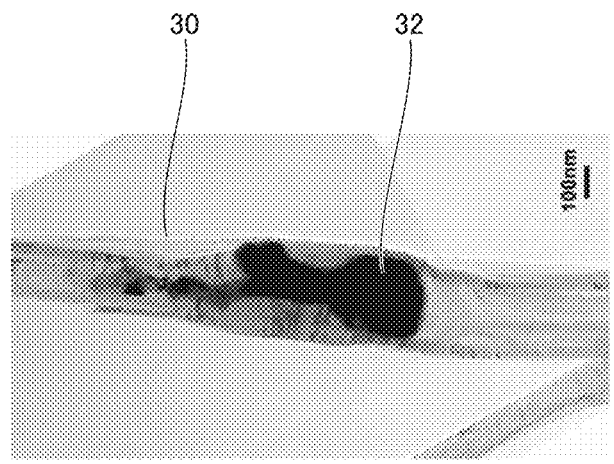
FIG. 9 is a photographic enlargement showing an example of a formed carbon nanostructure.
Figure 10:
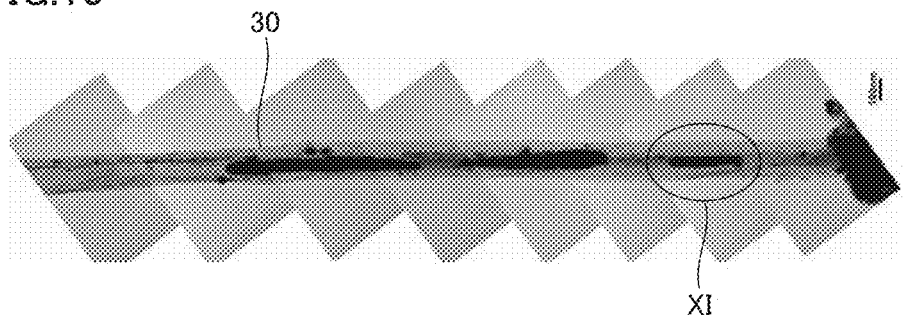
FIG. 10 is a photographic enlargement showing an example of a formed carbon nanostructure.
Figure 11:
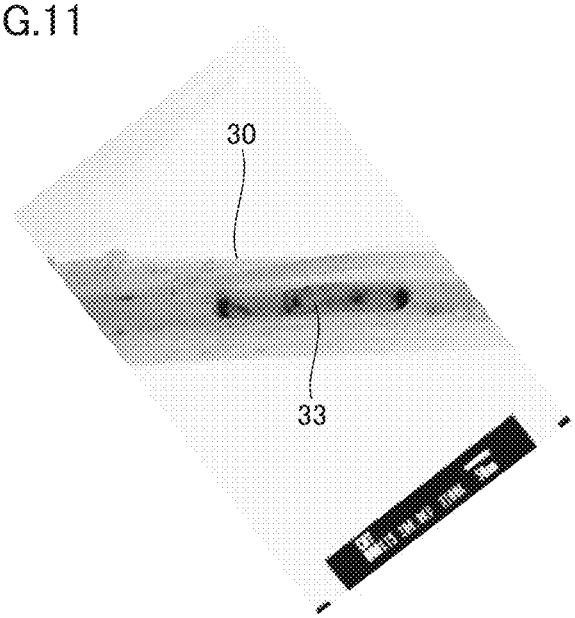
FIG. 11 is a photographic enlargement showing a region XI in FIG. 10.

In the method for manufacturing the carbon nanostructure according to the present invention described above, only the fractured end face (separation interface region) of base body portion 25 containing iron oxide, for example, is carburized, and a carbon nanostructure (e.g., carbon nanotube) is grown continuously while sequentially separating nanoparticles (e.g., iron nanoparticles) containing a component (a catalyst, e.g., iron) constituting base body portion 25 from the end surface. Specifically, 1) by locally heating a portion of base body 20 to be fractured to be base body portion 25 (refer to FIG. 3) by a laser beam, and supplying a source gas in proximity to the region, carburization progresses successively from the surface of the base body. 2) Then, base body 20 is fractured, and the carburized catalyst (iron) is separated in nanosize scale from the fractured end face of base body portion 25 to pull out a carbon nanostructure which connects base body portion 25 and the separated catalyst (or base body portion 26). 3) Carburization progresses further, and as shown in FIGS. 9 to 11, carbon nanostructure 30 is grown with the carburized catalyst (iron) of fine size successively separated from base body portion 25 as particles (iron particles 32) or nanofilaments (iron nanofilaments 33), for example, and held within carbon nanostructure 30 (from a different viewpoint, carbon nanostructure 30 is grown so as to connect iron particles 32 and iron nanofilaments 33 (catalyst) having been separated). 4) With the separation of the catalyst, a newly formed surface appears at the fractured end face of base body portion 25, and carburization (or oxidation and carburization) progresses in the newly formed surface, which sustains growth of carbon nanostructure 30 as described above. Although iron particles 32 and the like are included in the pulled-out carbon nanostructure 30, a graphene layer on the periphery is maintained. As a result, long carbon nanostructure 30 is formed.

Second Embodiment

A method for manufacturing a carbon nanostructure according to a second embodiment of the present invention will be described with reference to FIG. 8.

Figure 8:
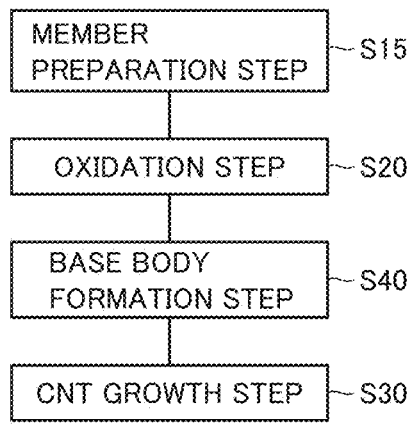
FIG. 8 is a flowchart for describing a method for manufacturing a carbon nanostructure according to a second embodiment of the present invention.

Although the method for manufacturing the carbon nanostructure shown in FIG. 8 basically includes a configuration similar to that of the method for manufacturing the carbon nanostructure shown in FIG. 1, the former is different from the latter in that the catalyst member and the separation member are preliminarily oxidized before the base body is formed. In other words, in the method for manufacturing the carbon nanostructure shown in FIG. 8, a member preparation step (S15) is first performed. In this step (S15), a catalyst member and a separation member are prepared.

Next, the oxidation step (S20) is performed. In this step (S20), the catalyst member and the separation member are oxidized. An arbitrary method can be used as a method for oxidation. For example, a method for heating the catalyst member and the separation member in the atmosphere can be used.

Next, a base body formation step (S40) is performed. In this step (S40), the catalyst member and the separation member are joined. An arbitrary method, such as welding or crimping, can be used as a method for joining.

Next, the CNT growth step (S30) is performed similarly to the manufacturing method shown in FIG. 1. With this as well, the carbon nanostructure with reduced bend can be obtained similarly to the manufacturing method shown in FIG. 1.

Now, characteristic features of the present invention will be listed, although they may partially be redundant as seen in the embodiments described above.

The method for manufacturing the carbon nanostructure according to the present invention includes the step of preparing a base body (preparation step (S10) and oxidation step (S20)), and the step of growing a carbon nanostructure (CNT growth step (S30)). In the step of preparing base body 20 formed of the catalyst member (base body portion 25) including a catalyst and the separation member (base body portion 26) that are in contact with or integral with each other, at least a part of a contact portion or an integral portion of the catalyst member (base body portion 25) and the separation member (base body portion 26) having been oxidized, is prepared. In the step of growing a carbon nanostructure (S30), carbon nanostructure 30 is grown in the separation interface region between the catalyst member and the separation member by heating base body 20 with the separation member (base body portion 26) being separated from the catalyst member (base body portion 25) while supplying a source gas containing carbon to base body 20. The step of growing a carbon nanostructure (S30) includes at least one of the step of locally supplying the source gas to a portion of the catalyst member (base body portion 25) facing the separation interface region where carbon nanostructure 30 is being grown, and the step of locally heating the separation interface region.

With this, in the above-described separation interface region of the catalyst member (base body portion 25), the process of reduction, carburization and growth of carbon nanostructure 30 will progress locally. Furthermore, since the tip of carbon nanostructure 30 (the end opposite to the end on the catalyst member side) is connected to the separation member (base body portion 26), a constant tension can be applied to carbon nanostructure 30 by separating the separation member from the catalyst member. Therefore, in the above-described separation interface region of the catalyst member (base body portion 25), as carbon nanostructure 30 is grown, a part of the carbonized catalyst member (base body portion 25) is separated to be drawn into carbon nanostructure 30 as fine particles (iron particles 32 or iron nanofilaments 33). With the separation of a part of the catalyst member, the newly formed surface of the catalyst member is exposed in the separation interface region, and the process of reduction, carburization and growth of carbon nanostructure 30 newly progresses at the newly formed surface. Such a process is promoted particularly by locally heating the above-described separation interface region of the catalyst member (base body portion 25) by laser beam 17 or the like, or by locally supplying the source gas to the separation interface region. As a result, long carbon nanostructure 30 with reduced occurrence of a bend and the like can be obtained.

In the above-described method for manufacturing the carbon nanostructure, in the step of growing a carbon nanostructure (S30), both of the step of supplying the source gas (the step of supplying the source gas by source gas introduction member 22) and the step of locally heating the separation interface region (the step of locally heating base body 20 by laser beam 17) may be performed. In this case, in the separation interface region, the process of generation of the newly formed surface described above, and reduction, carburization and growth of carbon nanostructure 30 at the newly formed surface can be promoted further effectively.

The method for manufacturing the carbon nanostructure according to the present invention includes the step of preparing a base body (preparation step (S10) and oxidation step (S20)), and the step of growing a carbon nanostructure (CNT growth step (S30)). In the step of preparing a base body, a base body formed of a catalyst member (base body portion 25) including a catalyst and a separation member (base body portion 26) that are in contact with or integral with each other, at least a part of a contact portion or an integral portion of the catalyst member (base body portion 25) and the separation member (base body portion 26)

having been oxidized is prepared. In the step of growing a carbon nanostructure (S30), carbon nanostructure 30 is grown in the separation interface region between the catalyst member and the separation member by heating base body 20 with the separation member being separated from the catalyst member while supplying a source gas containing carbon to base body 20. In the step of growing a carbon nanostructure (S30), the catalyst member (base body portion 25) is partially separated from a surface portion of the catalyst member (base body portion 25) where carbon nanostructure 30 is being grown to be drawn into the carbon nanostructure, so that carbon nanostructure 30 is grown continuously while the newly formed surface appears at the surface portion.

With this, at the newly formed surface of the catalyst member (base body portion 25) exposed successively in the separation interface region, the process of reduction, carburization and growth of a carbon nanostructure will progress. As a result, growth of carbon nanostructure 30 by the separation member extending in the direction away from the catalyst member is maintained continuously. Therefore, long carbon nanostructure 30 with reduced occurrence of a bend and the like can be obtained.

In the above-described method for manufacturing the carbon nanostructure, in the step of growing a carbon nanostructure (S30), a portion other than the separation interface region in the catalyst member (base body portion 25) may be cooled by cooling member 18. In this case, the state where the separation interface region has been locally heated can be achieved easily. Therefore, growth of carbon nanostructure 30 with reduced occurrence of a bend and the like can be promoted further.

In the above-described method for manufacturing the carbon nanostructure, in the step of growing a carbon nanostructure (S30), carbon nanostructure 30 may be grown in the state where particles containing the catalyst member are included within carbon nanostructure 30 (iron particles 32 or iron nanofilaments 33). A plurality of particles may be included in carbon nanostructure 30. In this case, the state is brought about in which the portion separated from the catalyst member when the newly formed surface is formed in the catalyst member is included within carbon nanostructure 30 as particles. In this way, with the portion separated from the catalyst member held within carbon nanostructure 30, the possibility that the separated portion may be brought into contact with the surface of the catalyst member again to inhibit growth of carbon nanostructure 30 can be reduced.

In the above-described method for manufacturing the carbon nanostructure, the catalyst member (base body portion 25) may contain metal that dissolves carbon. In this case, carbon in the source gas is carburized into the metal, and carbon nanostructure 30 can be easily grown on the surface of the metal.

In the method for manufacturing the carbon nanostructure described above, the metal may be one type of metal selected from the group consisting of iron, nickel and cobalt. In this case, carbon nanostructure 30 can be reliably grown on the surface of the metal.

In the above-described method for manufacturing the carbon nanostructure, the base body may contain at least one type selected from the group consisting of FeO, $Fe_3O_4$, and $Fe_2O_3$. In this case, carbon nanostructure 30 can be easily grown in the separation interface region in base body 20.

In the above-described method for manufacturing the carbon nanostructure, the catalyst member (base body portion 25) may be a porous body (e.g., a green compact of porous wustite or iron oxide). In this case, since a part of the catalyst member can be easily separated from the separation interface region of the catalyst member as carbon nanostructure 30 is grown, a newly formed surface can be formed reliably in the catalyst member. As a result, long carbon nanostructure 30 can be grown easily.

In the above-described method for manufacturing the carbon nanostructure, in the step of growing a carbon nanostructure (S30), the source gas may be discharged in the direction opposite to the direction in which the separation member is separated from the catalyst member (the direction indicated by arrow 31 in FIG. 7). In this case, occurrence of problems such as breakdown of carbon nanostructure 30 that would be caused by a gas, produced with a reaction when carbon nanostructure 30 is grown in the separation interface region of the catalyst member (e.g., in the case where the base body contains iron oxide, carbon monoxide (CO), carbon dioxide ($CO_2$), water ($H_2O$), or the like produced by decomposition of iron oxide when a carbon nanostructure is grown), contacting carbon nanostructure 30 being grown can be restrained.

In the method for manufacturing the carbon nanostructure described above, in the CNT growth step (S30) of growing the carbon nanostructure, a tension may be applied to carbon nanostructure 30 through at least one of the catalyst member and the separation member. In this case, by controlling the tension, carbon nanostructure 30 with reduced bend can be obtained reliably.

In the method for manufacturing the carbon nanostructure described above, in the preparation step (S10), base body 20 may be prepared by joining the catalyst member and the separation member. In the CNT growth step (S30) of growing carbon nanostructure 30, the separation member may be separated from the catalyst member by fracturing the joint portion where the catalyst member and the separation member are joined. In this case, by controlling the shape and the like of the joint portion of the catalyst member and the separation member and causing the fracture to occur at the joint portion, the site where carbon nanostructure 30 is formed and the shape of carbon nanostructure 30 can be controlled.

In the method for manufacturing the carbon nanostructure described above, in the preparation step (S10) of preparing the base body, a single member (e.g., pure iron foil) formed of the catalyst may be prepared as base body 20, as shown in FIGS. 2, 3 and the like. In the oxidation step (S20), at least a part of the single member may be oxidized. In the step of bringing the source gas into contact with the catalyst member and/or the separation member in the CNT growth step (S30), the source gas may be brought into contact with the single member. In the CNT growth step (S30) of growing the carbon nanostructure, the source gas may be brought into contact with base body 20 that is the single member, and then, (or with the source gas being in contact with base body 20), by heating base body 20 while fracturing base body 20 to separate base body 20 into two portions (base body portions 25 and 26 in FIG. 4), carbon nanostructure 30 may be grown in the separation interface region between two base body portions 25 and 26. The catalyst member and the separation member may be above-described two base body portions 25 and 26 obtained by fracturing base body 20 that is the single member. In this case, by using the single member as base body 20, the process of manufacturing carbon nanostructure 30 can be simplified as compared with the case of performing the step of integrating the catalyst member and the separation member.

Carbon nanostructure 30 according to the present invention includes a linear structure portion made of carbon having a length of more than or equal to 1 mm, and metal nanoparticles (iron particles 32 or iron nanofilaments 33) arranged within the linear structure portion in a dispersed manner. With this, the characteristics of carbon nanostructure 30 can be adjusted by appropriately selecting the type of the metal nanoparticles (e.g., the magnetic property of the carbon nanostructure can be adjusted by arranging magnetic metal as metal constituting, the metal nanoparticles).

In the above-described carbon nanostructure, the linear structure portion may be a cylindrical object, and the metal nanoparticles (iron particles 32 or iron nanofilaments 33) may be located on the inner peripheral side of the cylindrical object. In this case, the metal nanoparticles can be held within the carbon nanostructure with the essential construction of carbon nanostructure 30 held in the linear structure portion.

As shown in FIG. 2, the apparatus for manufacturing the carbon nanostructure according to the present invention includes a holding portion (base platform 8 and fixing blocks 9 to 12 in FIG. 2), driving member 2, a gas supply portion (gas supply portion 3 and/or source gas introduction member 22), and the heating member (laser beam oscillation portion 16). The holding portion is capable of holding base body 20 formed of a catalyst member including a catalyst and a separation member that are in contact with or integral with each other, at least a part of a contact portion or an integral portion of the catalyst member and the separation member having been oxidized, on the catalyst member side and on the separation member side. Driving member 2 moves the holding portion (fixing blocks 11 and 12 in the manufacturing apparatus shown in FIG. 2) to separate the separation member from the catalyst member. The gas supply portion supplies a source gas to base body 20. The heating member is capable of locally heating a part of base body 20.

By using such apparatus, long carbon nanostructure 30 with reduced bend can be grown in the separation interface region between the catalyst member and the separation member, namely, in the fracture interface between base body portions 25 and 26 obtained by fracturing base body 20 as shown in FIG. 4.

The apparatus for manufacturing the carbon nanostructure may further include cooling members 18 and 19 cooling a part of the catalyst member. In this case, the state where the separation interface region has been locally heated can be achieved easily. Therefore, growth of long carbon nanostructure 30 with reduced occurrence of a bend and the like can be promoted further.

In the apparatus for manufacturing the carbon nanostructure, the gas supply portion (source gas introduction member 22) may supply a source gas toward a part of base body 20 locally heated by heating member 4 and/or laser beam oscillation portion 16. In this case, by locally supplying the reactive gas to the separation interface region, the carbon nanostructure can be locally grown in the separation interface region. Therefore, growth of the long carbon nanostructure with reduced occurrence of a bend and the like can be promoted further.

<Experiment 1>

An experiment described below was conducted in order to check the effect of the present invention. First, an iron oxide foil (purity of 5N) having a thickness of 50 μm and having a narrowed central portion in planar shape was prepared as the base body. Then, the base body formed of the iron oxide foil was held by fixing blocks 9 to 12 within a reaction chamber, as shown in FIG. 3. Then, after removing oxygen from the reaction chamber of a heating furnace, an acetylene gas (5% acetylene and 95% nitrogen) was supplied.

In this state, the narrowed portion of the base body was locally subjected to intensive heating by a laser beam, and a portion other than the narrowed portion was brought into contact with and cooled by a cooling member formed of a water-cooled chamber. At this time, the central part of the narrowed portion of the base body was adjusted to have a temperature of about 850° C., which was the highest. Then, after iron oxide constituting the base body was reduced, the base body was fractured applying a tension, thereby forming a carbon nanostructure (carbon nanofibers) between the ruptured surfaces of the base body (between the fractured end faces of base body portion 25 and base body portion 26 shown in FIG. 4).

Thereafter, laser beam irradiation and cooling by cooling members 18 and 19 were adjusted such, that only the fractured end face of fractured base body portion 25 was heated with a tension applied continuously. Then, a carbon nanostructure having a length of 500 μm was obtained.

On the other hand, a carbon nanostructure was formed on the fractured end faces of the base body with a similar device configuration applying a tension to the base body while heating the entire base material in an electric furnace (at 850° C. for 10 minutes). In this case, the carburization reaction occurred on the entire surface of the base member, and a carbon nanostructure was grown between the fractured end faces (cracked portion), but growth of a carbon nanostructure was stopped at the length of about 80 μm.

<Experiment 2>

An experiment described below was conducted in order to check the effect of the present invention. First, an iron oxide foil (purity of 4N) having a thickness of 50 μm and having a narrowed central portion in planar shape was prepared as the base body. Then, the base body formed of the iron oxide foil was held by fixing blocks 9 to 12 within a reaction chamber, as shown in FIG. 3. Then, a stainless steel pipe as source gas introduction member 22 was brought close to the vicinity of the narrowed portion of the base body, and an acetylene gas (10% acetylene and 90% nitrogen) was flown to be supplied intensively to the narrowed portion of the base body. A nitrogen gas was flown in the entire reaction chamber in the direction opposite to the direction of pulling out a carbon nanostructure. With this nitrogen gas, a gas containing oxygen produced during growth of a carbon nanostructure was promptly discharged to the outside of the reaction chamber.

In this state, the narrowed portion of the base body was locally subjected to intensive heating by a laser beam, and a portion other than the narrowed portion was brought into contact with and cooled by a cooling member formed of a water-cooled chamber. At this time, the central part of the narrowed portion of the base body was adjusted to have a temperature of about 900° C., which was the highest. Then, after iron oxide constituting the base body was reduced, the base body was fractured applying a tension, thereby forming a carbon nanostructure (carbon nanofibers) between the ruptured surfaces of the base body (between the fractured end faces of base body portion 25 and base body portion 26 shown in FIG. 4).

Thereafter, laser beam irradiation and cooling by cooling members 18 and 19 were adjusted such that only the fractured end face of fractured base body portion 25 was heated with a tension applied continuously. Then, a carbon nanostructure having a length of 800 μm was obtained.

On the other hand, a carbon nanostructure was formed on the fractured end faces of the base body with a similar device configuration applying a tension to the base body while heating the entire base material in an electric furnace (at 850° C. for 7 minutes). In this case, the carburization reaction occurred on the entire surface of the base member, and a carbon nanostructure was grown between the fractured end faces (cracked portion), but growth of a carbon nanostructure was stopped at the length of about 50 μm.

<Experiment 3>

An experiment described below was conducted in order to check the effect of the present invention. First, a green compact of iron oxide ($Fe_3O_4$) was prepared as the base body. The base body formed of the compact had a shape with a narrowed central portion in planar shape and had a thickness of 100 μm. Then, the base body was held by fixing blocks 9 to 12 within a reaction chamber, as shown in FIG. 3. Then, a stainless steel pipe as source gas introduction member 22 was brought close to the vicinity of the narrowed portion of the base body, and an acetylene gas (15% acetylene and 85% nitrogen) was flown to be supplied intensively to the narrowed portion of the base body. A nitrogen gas was flown in the entire reaction chamber in the direction opposite to the direction of pulling out a carbon nanostructure. With this nitrogen gas, a gas containing oxygen produced during growth of a carbon nanostructure was promptly discharged to the outside of the reaction chamber.

In this state, the narrowed portion of the base body was locally subjected to intensive heating by a laser beam, and a portion other than the narrowed portion was brought into contact with and cooled by a cooling member formed of a water-cooled chamber. At this time, the central part of the narrowed portion of the base body was adjusted to have a temperature of about more than or equal to 800° C. and less than or equal to 900° C., which was the highest. Then, after iron oxide constituting the base body was reduced, the base body was fractured applying a tension, thereby forming a carbon nanostructure (carbon nanofibers) between the ruptured surfaces of the base body (between the fractured end faces of base body portion 25 and base body portion 26 shown in FIG. 4).

Thereafter, laser beam irradiation and cooling by cooling members 18 and 19 were adjusted such that only the fractured end face of fractured base body portion 25 was heated with a tension applied continuously. Then, a carbon nanostructure having a length of 1500 μm was obtained.

On the other hand, a carbon nanostructure was formed on the fractured end faces of the base body with a similar device configuration applying a tension to the base body while heating the entire base material in an electric furnace (at 850° C. for 7 minutes). In this case, the carburization reaction occurred on the entire surface of the base member, and a carbon nanostructure was grown between the fractured end faces (cracked portion), but growth of a carbon nanostructure was stopped at the length of about 100 μm.

It should be understood that the embodiments disclosed herein are illustrative and non-restrictive in every respect. The scope of the present invention is defined by the claims not by the description above, and is intended to include any modification within the meaning and scope equivalent to the terms of the claims.

INDUSTRIAL APPLICABILITY

According to the present invention, a long carbon nanostructure with reduced bend can be obtained.

REFERENCE SIGNS LIST

1 reaction chamber; 2 driving member; 3 gas supply portion; 4 heating member; 6 discharge portion, 7 pump; 8 base platform; 9-12 fixing block; 13 coupling rod; 14 controller; 15 laser beam introduction portion; 16 laser beam oscillation portion; 17 laser beam; 18, 19 cooling member; 20 base body; 21 notch; 22 source gas introduction member; 24 optical system; 25, 26 base body portion; 27, 31 arrow; 30 carbon nanostructure; 32 iron particles; 33 iron nanofilaments.

The invention claimed is:

1. A method for manufacturing a carbon nanostructure, comprising the steps of:
    preparing a base body formed of a catalyst member including a catalyst and a separation member that are integral with each other, at least a part of an integral portion of said catalyst member and said separation member having been oxidized; and
    growing a carbon nanostructure in a fracture interface region between said catalyst member and said separation member, by heating said base body with said separation member being separated from said catalyst member while supplying a source gas containing carbon to said base body,
    said step of growing a carbon nanostructure including at least one of a step of locally supplying said source gas to a portion of said catalyst member facing said fracture interface region where said carbon nanostructure is being grown, and a step of locally heating said fracture interface region.

2. The method for manufacturing a carbon nanostructure according to claim 1, wherein, in said step of growing a carbon nanostructure, both of said step of supplying a source gas and said step of locally heating said fracture interface region are performed.

3. The method for manufacturing a carbon nanostructure according to claim 1, wherein, in said step of growing a carbon nanostructure, a portion other than said fracture interface region in said catalyst member is cooled.

4. The method for manufacturing a carbon nanostructure according to claim 1, wherein, in said step of growing a carbon nanostructure, said carbon nanostructure is grown with particles containing said catalyst member being included within said carbon nanostructure.

5. The method for manufacturing a carbon nanostructure according to claim 1, wherein said catalyst member contains metal that dissolves carbon.

6. The method for manufacturing a carbon nanostructure according to claim 5, wherein said base body contains at least one type selected from the group consisting of FeO, $Fe_3O_4$ and $Fe_2O_3$.

7. The method for manufacturing a carbon nanostructure according to claim 1, wherein said catalyst member is a porous body.

8. The method for manufacturing a carbon nanostructure according to claim 1, wherein, in said step of growing a carbon nanostructure, said source gas is discharged from said catalyst member in a direction opposite to a direction in which said separation member is separated from said catalyst member.

9. A method for manufacturing a carbon nanostructure, comprising the steps of:
    preparing a base body formed of a catalyst member including a catalyst and a separation member that are integral with each other, at least a part of an integral portion of said catalyst member and said separation member having been oxidized; and
    growing a carbon nanostructure in a fracture interface region between said catalyst member and said separation member, by heating said base body with said separation member being separated from said catalyst member while supplying a source gas containing carbon to said base body, in said step of growing a carbon nanostructure, by partially separating said catalyst member from a surface portion of said catalyst member where said carbon nanostructure is being grown to be drawn into said carbon nanostructure, said carbon nanostructure is grown continuously while a newly formed surface appears at said surface portion.

\* \* \* \* \*